United States Patent [19]
Goronkin et al.

[11] Patent Number: 5,883,404
[45] Date of Patent: Mar. 16, 1999

[54] COMPLEMENTARY HETEROJUNCTION SEMICONDUCTOR DEVICE

[75] Inventors: Herbert Goronkin, Tempe; Saied Nikoo Tehrani, Scottsdale; Jun Shen, Phoenix, all of Ariz.

[73] Assignee: Motorola, Inc., Schaumburg, Ill.

[21] Appl. No.: 297,279

[22] Filed: Aug. 29, 1994

[51] Int. Cl.$^6$ ............... H01L 31/0328; H01L 31/0336; H01L 31/072; H01L 31/109
[52] U.S. Cl. .......................... 257/192; 257/194; 257/369
[58] Field of Search ........................ 257/192, 194, 257/369

[56] References Cited

U.S. PATENT DOCUMENTS

| | | | |
|---|---|---|---|
| 4,768,076 | 8/1988 | Aoki et al. | 257/194 |
| 4,882,608 | 11/1989 | Smith, III | 257/64 |
| 5,079,601 | 1/1992 | Esaki et al. | 257/64 |
| 5,113,231 | 5/1992 | Soderstrom et al. | 257/192 |
| 5,142,349 | 8/1992 | Zhu et al. | 257/192 |
| 5,349,214 | 9/1994 | Tehrani et al. | 257/192 |

FOREIGN PATENT DOCUMENTS

| | | | |
|---|---|---|---|
| 2257669 | 10/1990 | Japan | 257/192 |

*Primary Examiner*—Stephen D. Meier
*Attorney, Agent, or Firm*—Eugene A. Parsons; William E. Koch

[57] ABSTRACT

A complementary heterojunction semiconductor device (10) has a first resonant interband tunneling transistor (12) coupled to a second resonant interband tunneling transistor (14) through a common output (16). The first transistor (12) has a first gate (18) of a first semiconductor type and a drain (28) coupled to the first gate (18). The first gate (18) is also coupled to the common output (16). The second transistor (14) has a second gate (32) of a second semiconductor type and a source (42) coupled to the second gate (32). The second gate (32) is also coupled to the common output (16). The valence band (60,80,82) of the first semiconductor type has an energy level greater than the conduction band (62, 64,84) of the second semiconductor type.

22 Claims, 2 Drawing Sheets

COMPLEMENTARY HETEROJUNCTION SEMICONDUCTOR DEVICE

BACKGROUND OF THE INVENTION

The present invention relates, in general, to semiconductor devices and, more particularly, to a heterojunction semiconductor device having a complementary structure.

Existing digital integrated circuits are usually designed using metal oxide semiconductors (MOSs) having a logical on or off state. Typically, these designs are implemented using well-known complementary MOS (CMOS) circuits. However, the use of such two-state MOS devices makes further integration of devices with ever smaller geometries difficult when the critical dimensions of these devices become sufficiently small that electron tunneling begins to occur between critical portions of the devices.

As device geometries shrink, it is preferable to design integrated circuits using devices having more functionality than that provided by the two stable logical states of conventional CMOS transistors. An example of a device having more than two-state functionality is a resonant interband tunneling transistor (RITT). An RITT is able to replace two or more conventional two-state transistors and can be used to further increase the density of an integrated circuit. However, as of yet, RITTs have not been provided in a complementary structure analogous to that used in conventional CMOS circuits. Another limitation of CMOS devices is that their switching speed, such as observed in a simple inverter, is limited by the slower, p-channel transistor. It would be preferable for both transistors of a complementary transistor pair to operate at a speed substantially equal to that of an n-channel transistor.

Therefore, it is desirable to have a heterojunction semiconductor device that has a complementary structure, that provides more than two-state functionality, and that provides a complementary pair of devices, each of which operates at a high speed.

DETAILED DESCRIPTION OF THE DRAWINGS

Briefly stated, the present invention provides a complementary heterojunction semiconductor device having a first resonant interband tunneling transistor coupled to a second resonant interband tunneling transistor through a common output. The first transistor has a first gate of a first semiconductor type and a drain coupled to the first gate. The first gate is also coupled to the common output. The second transistor has a second gate of a second semiconductor type and a source coupled to the second gate. The second gate is also coupled to the common output. The valence band of the first semiconductor type has an energy level greater than the conduction band of the second semiconductor type. This is referred to in the art as a type II band offset.

Figure 1:
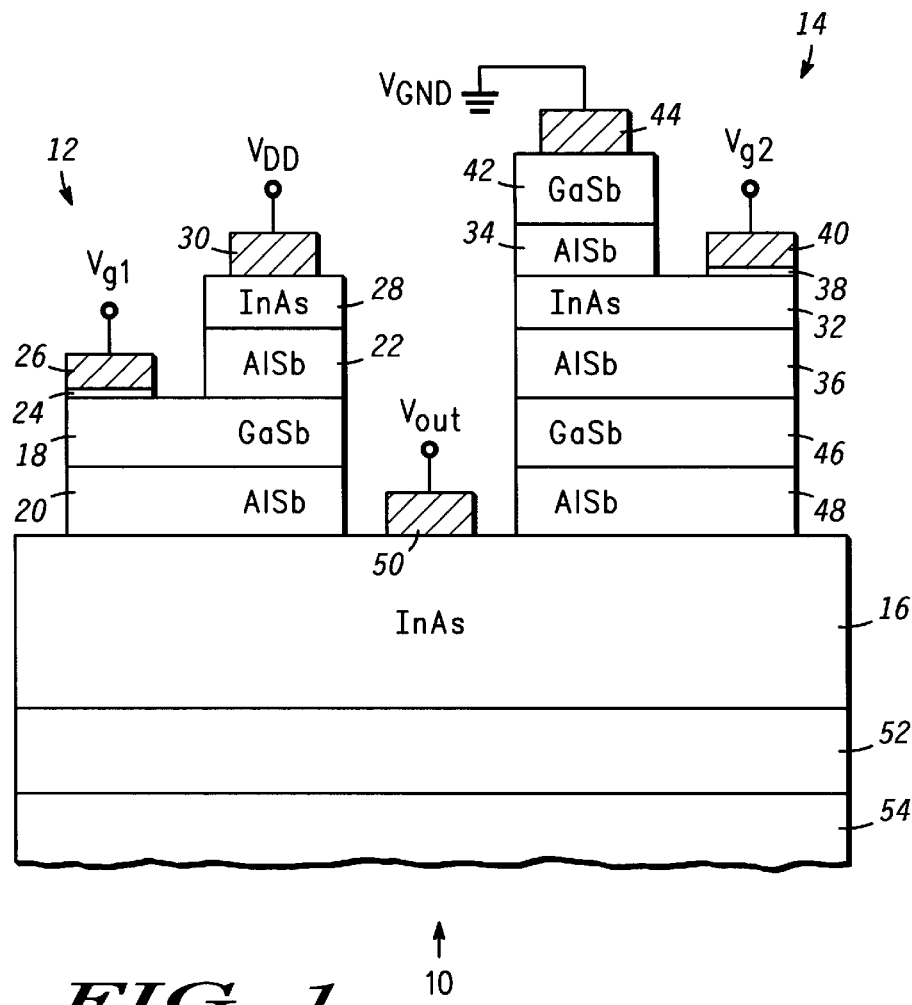
FIG. 1 illustrates a cross-section of a complementary heterojunction semiconductor device according to the present invention.

The present invention can be more fully described with reference to FIGS. 1–4. FIG. 1 illustrates a cross-section of a complementary heterojunction semiconductor device 10 according to the present invention. Device 10 comprises a first resonant interband tunneling transistor 12 and a second resonant interband tunneling transistor 14, both of which are connected to an indium arsenide (InAs) common output layer 16. RITT 12 has a gallium antimonide (Gasb) gate layer 18 between an aluminum antimonide (AlSb) barrier layer 20 and an AlSb barrier layer 22. An insulating layer 24 is on gate layer 18, and a gate contact 26 is on insulating layer 24. An InAs drain layer 28 is on barrier layer 22, and a drain contact 30 makes an ohmic contact to drain layer 28.

RITT 14 has an InAs gate layer 32 between an AlSb barrier layer 34 and an AlSb barrier layer 36. An insulating layer 38 is on gate layer 32, and a gate contact 40 is on insulating layer 38. A GaSb source layer 42 is on barrier layer 34, and a source contact 44 makes an ohmic contact to source layer 42. A GaSb coupling layer 46 and an AlSb barrier layer 48 connect RITT 14 to common output layer 16. An output contact 50 makes an ohmic contact to common output layer 16. An epitaxial buffer layer 52 supports common output layer 16 and is grown on a substrate 54, which may be for example semi-insulating GaAs.

According to the present invention, RITTs 12 and 14 work together to provide a complementary operation for heterojunction semiconductor device 10. This complementary operation is exemplified in one case by a simple inverter, which may be formed by connecting drain contact 30 to a potential $V_{DD}$ and connecting source contact 44 to a potential $V_{GND}$. A gate bias $V_{g1}$ is applied to gate contact 26, and a gate bias $V_{g2}$ (which is tied to $V_{g1}$ for this particular case of an inverter) is applied to gate contact 40. An output potential $V_{out}$ is provided by output contact 50 and is the output for the inverter. Although a simple inverter is described here, one skilled in the art will recognize that $V_{g1}$ and $V_{g2}$ need not be tied together in other embodiments and that the complementary operation according to the present invention is not restricted merely to use in inverters. Instead, a complementary heterojunction device according to the present invention may be used in other, more complex logical circuits.

Figure 2:
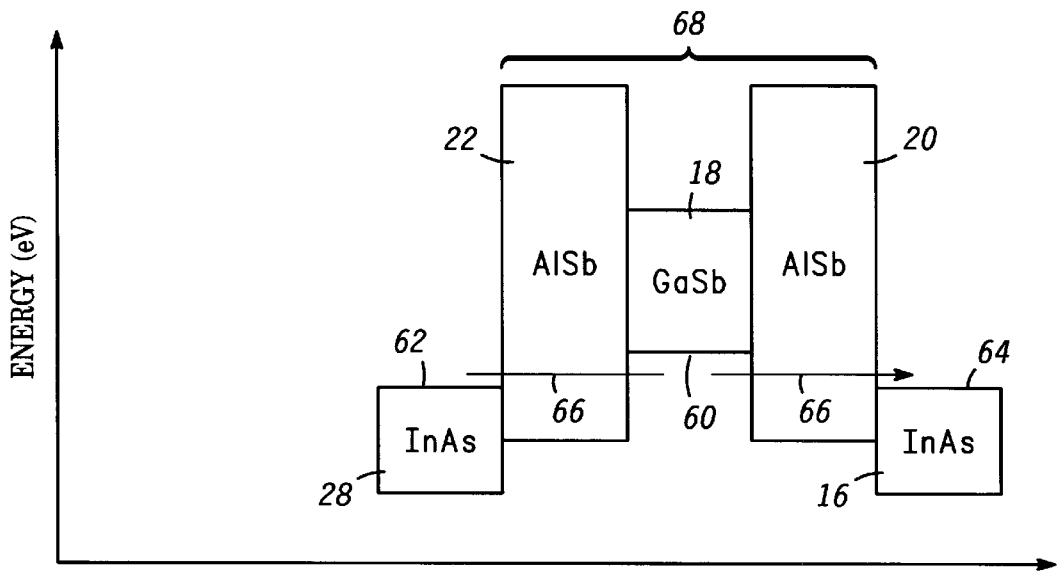
FIGS. 2 and 3 illustrate band energy diagrams for the device of FIG. 1 in an unbiased state.
Figure 3:
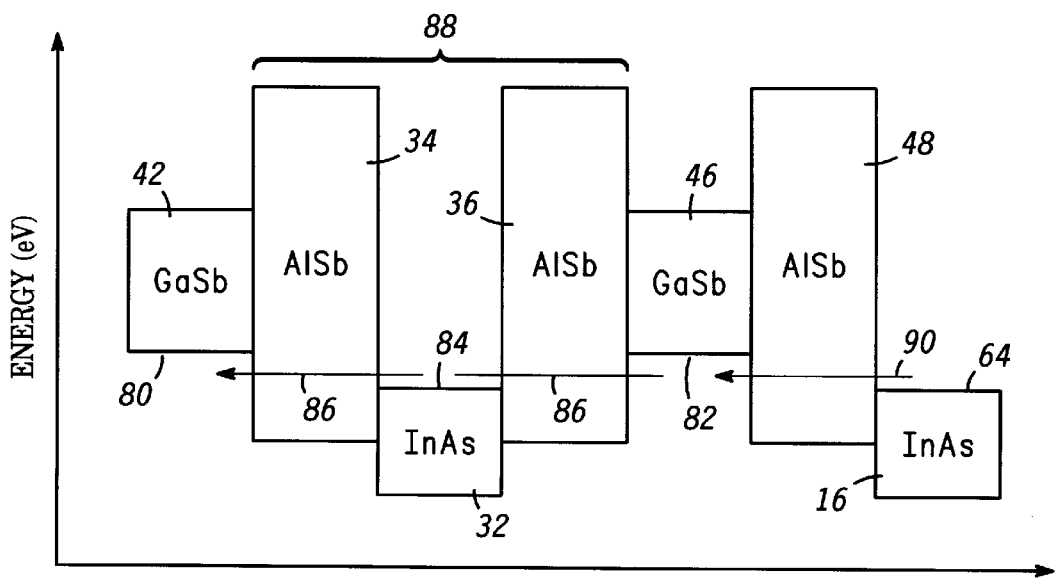

The complementary operation of device 10 discussed above can now be more generally described with reference to FIGS. 2 and 3, which illustrate band energy diagrams for device 10 in an unbiased state. Specifically, FIG. 2 illustrates a simplified electron energy band diagram for RITT 12, and FIG. 3 illustrates a simplified electron energy band diagram for RITT 14. As used herein, an unbiased state of device 10 refers to a state where no external potential is applied thereto. In other words, $V_{g1}$, $V_{g2}$, $V_{DD}$, $V_{GND}$, and $V_{out}$ are all at a common potential. FIGS. 2 and 3 illustrate device 10 in such an unbiased state. Common reference numbers are used in FIGS. 2 and 3 to refer to the corresponding elements of device 10 as shown in FIG. 1.

An important aspect of the present invention with respect to the band energies illustrated in FIGS. 2 and 3 is that the compound semiconductor material selected for gate layer 18 have a valence band with an energy level greater than the energy level of the conduction band of the compound semiconductor material selected for gate layer 32. More specifically, in FIG. 2 valence band 60 of GaSb gate layer 18 has an energy level greater than conduction bands 62 and 64 (of InAs drain layer 28 and InAs common output layer 16, respectively) when device 10 is in an unbiased state. Further, in FIG. 3, valence bands 80 and 82 of GaSb source layer 42 and GaSb coupling layer 46 have an energy level greater than conduction band 84 of InAs gate layer 32 when device 10 is in an unbiased state. In addition, InAs gate layer 32 is made sufficiently thin, for example about 100 angstroms, to provide a conduction band ground state therefor which is higher in energy than the valence band ground state of GaSb gate layer 18.

Current flow in RITTs 12 and 14 occurs through barrier layers that are made sufficiently thin to permit electron tunneling, and this tunneling is indicated by arrows 66 and 86 in FIGS. 2 and 3. Electron tunneling for RITT 12 is indicated by arrow 66 in FIG. 2, and electron tunneling for RITT 14 is indicated by arrow 86 in FIG. 3. Accordingly, barrier layers 20, 22, 34, and 36 are sized appropriately to permit such tunneling with a thickness of less than, for example, about 100 angstroms.

Although one skilled in the art will recognize that electron tunneling substantially does not occur when device 10 is in an unbiased state as illustrated in FIGS. 2 and 3, electron tunneling and current flow are discussed herein with reference to FIGS. 2 and 3 for simplicity of illustration. One skilled in the art will appreciate that biasing of device 10 will change these simplified band energy diagrams in a known way.

Referring now to FIG. 2, a quantum well 68 is formed by barrier layers 20 and 22 and gate layer 18 (gate layer 18 acts here as a quantum well layer). Electrons in the conduction band of quantum well 68 are confined to discrete energy states that are determined by quantum mechanical conditions known to one of skill in the art, which conditions include the size of quantum well 68 and the effective mass of the electrons in the material forming quantum well 68. Similarly, holes in the valence band of quantum well 68 are also confined to discrete energy states. When the energy of an electron in InAs drain layer 28 aligns with such a discrete energy level of GaSb gate layer 18, the electron tunnels through quantum well 68. This alignment is an example of what is called a "resonance condition" for quantum well 68.

Referring now to FIG. 3, a quantum well 88 is similarly formed by barrier layers 34 and 36 and gate layer 32. As described above for quantum well 68, electrons of quantum well 88 are confined to discrete energy states, and quantum well 88 exhibits resonance conditions when the energy level alignment discussed above occurs.

An additional component of electron tunneling in device 10 is indicated in FIG. 3 by arrow 90. Barrier layer 48 is made sufficiently thin to permit this tunneling. Coupling layer 46 and barrier layer 48 are used in this embodiment due to the particular structural requirements of this embodiment of device 10. However, one skilled in the art will recognize that in other embodiments of the present invention, coupling layer 46 and barrier layer 48 may not be required, depending on the method of manufacture used.

The operation of device 10 in a biased state is now discussed in more detail with reference again to the case of a simple inverter in which $V_{g1}=V_{g2}$. For this case a positive potential $V_{DD}$ (with respect to reference potential $V_{GND}$) is applied to drain contact 30, and a common gate bias is applied to gate contacts 26 and 40. During the operation of this inverter, the band levels of GaSb gate layer 18 and InAs gate layer 32 move up in response to an applied negative gate bias and down in response to an applied positive gate bias.

For a positive applied gate bias, current flows through quantum well 88, but is blocked from flowing through quantum well 68 by the lowered band gap of GaSb gate layer 18. Current flows through quantum well 88 because the ground state of an electron in quantum well 88 is resonant with the valence band states of GaSb source layer 42 and GaSb coupling layer 46, and thus hole flow can occur by tunneling. No current flows through quantum well 68 because the band levels of GaSb gate layer 18 have moved down so that no resonant state can exist.

For a negative gate bias, current flows through quantum well 68, but is blocked from flowing through quantum well 88 by the raised band gap of InAs layer 32. As appreciated by one of skill in the art, a resonant state similar to that above can be established for quantum well 68, but not for quantum well 88.

Now, an even more specific example of the operation of the simple inverter above is presented. When $V_{g1}$ and $V_{g2}$ are equal to $V_{DD}$, RITT 12 is turned off in a substantially non-conducting state, and RITT 14 is turned on in a substantially conducting state. As a result, Vout is approximately equal to $V_{GND}$. On the other hand, when $V_{g1}$ and $V_{g2}$ are equal to $V_{GND}$, RITT 12 is turned on and RITT 14 is turned off so that Vout is approximately equal to $V_{DD}$.

Figure 4:
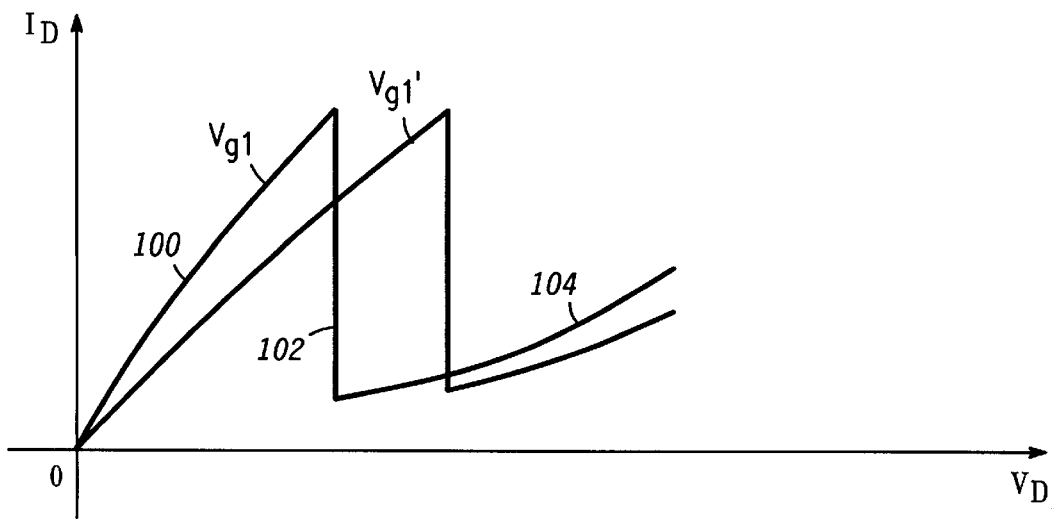
FIG. 4 is a graph of drain current versus voltage for a resonant interband tunneling transistor in two different gate bias states.

FIG. 4 is a graph of current ($I_D$) versus voltage ($V_D$) for RITT 12 in two different bias states corresponding to applied gate voltages $V_{g1}$ and $V'_{g1}$. This $I_D$-$V_D$ characteristic is described below with specific reference to InAs drain layer 28 for purposes of explanation, but one skilled in the art will recognize that a similar description will also apply for InAs common output layer 16.

As is typical of RITTs in general, for a first gate bias $V_{g1}$, $I_D$ initially increases in a curve portion 100. Specifically, for these lower values of $V_D$, tunneling occurs from the conduction band of, for example, InAs drain layer 28 to the valence band of GaSb gate layer 18. As $V_D$ increases, the band levels of GaSb gate layer 18 shift down so that the band gap of GaSb gate layer 18 is at substantially the same energy level as, for example, the conduction band of InAs drain layer 28, thus blocking further current flow. This blocking of current flow causes a sharp drop in $I_D$ and corresponds to a curve portion 102. However, as $V_D$ continues to increase, the band levels of GaSb gate layer 18 shift further down such that the band gap of GaSb gate layer 18 is at a lower energy level than, for example, the conduction band of InAs drain layer 28 and therefore no longer blocks current flow. Thus, $I_D$ again rises with increasing $V_D$ in a curve portion 104.

The $I_D$-$V_D$ characteristic of RITT 12 can be modulated by varying the applied gate bias. Specifically, the application of a second gate bias $V'_{g1}$ modulates the $I_D$-$V_D$ characteristic so that the above blockage of current flow occurs at a different value of $V_D$. This occurs because the different gate bias re-aligns the resonant states (discussed previously) in GaSb gate layer 18 relative to InAs layers 16 and 18. In FIG. 4, for example, $V'_{g1}$ is a more negative voltage than $V_{g1}$.

As will be appreciated by one of skill in the art, the just described characteristics for RITT 12 also apply in a similar manner to RITT 14. Further, it will be appreciated that the use of RITTs according to the present invention as described above provides a multi-functionality useful in logic design. This is due to the unique characteristics of an RITT as illustrated by the three distinct curve portions 100, 102, and 104 above. This behavior is in contrast to typical CMOS devices which exhibit a monotonically increasing current-voltage characteristic curve and are useful only as two-state devices.

Now, one specific method for the fabrication of device 10 is described. In general, device 10 may be formed of several epitaxial layers, which may be grown by molecular beam epitaxy or metal organic chemical beam deposition. Referring again to FIG. 1, buffer layer 52 is formed on substrate 54 by growing a step-graded InGaAs layer. This step-graded layer is used to accommodate the lattice change from the GaAs lattice constant of substrate 54 to the InAs lattice constant of layer 16. After forming buffer layer 52, InAs common output layer 16 is formed on buffer layer 52. Because common output layer 16 is used to connect both RITTs 12 and 14, it is preferable that layer 16 have a low resistance as can be achieved by doping it with an n-type dopant such as silicon.

A first AlSb barrier layer (which will later provide layers 20 and 48) of an approximate thickness of 10–30 angstroms is grown on top of layer 16, and a first GaSb layer (which will later provide layers 18 and 46) of a thickness of 60–100 angstroms is grown on top of the first AlSb barrier layer. A second AlSb barrier layer (which will later provide layers 22 and 36) of a thickness of 10–30 angstroms is grown on top of the first GaSb layer.

Next, an InAs layer (which will later provide layers 28 and 32) with an approximate thickness of 80–150 angstroms is grown, then a third AlSb layer (which will later provide layer 34) with a thickness of 10–30 angstroms is grown, and finally a second GaSb layer (which will later provide layer 42) with a thickness of 100–500 angstroms is grown.

After the growth of the several epitaxial layers above, RITTs 12 and 14 may be formed by appropriate masking and etching steps as will be recognized by one of skill in the art. Continuing the specific example from above, source contact 44 may be formed by evaporation of an ohmic metal onto layer 42. Source contact 44 is then used as a mask in a selective etch to provide GaSb layer 42 and AlSb layer 34. Drain contact 30 is then formed by an ohmic metal evaporation. Photoresist is next used to form a first opening for output contact 50. Appropriate etching of the several intervening epitaxial layers is used to form the first opening, with common output layer 16 acting as an etch stop. Then, output contact 50 may be formed in the first opening.

Photoresist is used to form a second opening for selectively removing InAs and AlSb layers 28 and 22 down to GaSb gate layer 18. Now, insulating layers 24 and 38 may both be formed. Insulating layers 24 and 38 may be grown epitaxially or may be deposited using chemical vapor deposition. Gate contacts 26 and 40 may then be evaporated onto insulating layers 24 and 38 to provide device 10. Insulating layers 24 and 38 are provided so that substantially no current flows from gate contacts 26 or 40. Current flowing through these layers would result in an undesirable leakage current. Suitable materials for insulating layers 24 and 38 include aluminum arsenide, aluminum arsenide antimonide, or gallium arsenide antimonide.

In the formation of device 10 it should be noted that it is important that the lattice constants of the GaSb, InAs, and AlSb layers discussed above, and including common output layer 16, all are within about 1% of each other. In device 10, buffer layer 52 is used to isolate lattice misfit dislocation damage from GaAs substrate 54, which has a lattice constant that is about 8% less than the lattice constant of InAs common output layer 16. When using buffer layer 52, any dislocation damage occurs near the interface of buffer layer 52 and substrate 54. If buffer layer 52 were not used, this dislocation would cause electrical degradation of the resonant tunnel structures in device 10.

By now, it should be appreciated that there has been provided a novel complementary heterojunction semiconductor device using two resonant interband tunneling transistors connected in series to provide a complementary common output. This device provides more functionality and greater speed than conventional, two-state CMOS circuits. From the above description, one of skill in the art will recognize that a complementary transistor pair has been provided in one embodiment by device 10. An advantage is that the switching speeds of RITTs 12 and 14 are substantially high, especially in contrast to prior CMOS transistor pairs using slow, p-channel devices.

Although a particular embodiment has been described above, one of skill in the art will recognize that other embodiments may also be formed according to the present invention. For example, device 10 may be formed using GaN and Si. Specifically, for RITT 12, gate layer 18 may be Si, and drain layer 28 and common output layer 16 may be GaN. Barrier layers 20 and 22 may be formed of AlN. Correspondingly, for RITT 14 in this example, gate layer 32 may be GaN, and source layer 42 and coupling layer 46 may be Si. Barrier layers 34, 36, and 48 could be formed of AlN, and buffer layer 52 and substrate 54 could be formed of Si. The materials described in this particular example have substantially similar lattice constants as previously discussed above.

We claim:

1. A complementary heterojunction semiconductor device, comprising:

a first resonant interband tunneling transistor having a first gate of a first compound semiconductor type, a drain coupled to said first gate, and a common output coupled to said first gate; and a second resonant interband tunneling transistor having a second gate of a second compound semiconductor type, said second gate coupled to said common output, and a source coupled to said second gate, wherein said first compound semiconductor type has a valence band having an energy greater than a conduction band of said second compound semiconductor type when said complementary heterojunction semiconductor device is in an unbiased state.

2. The device of claim 1 wherein:

a first barrier is disposed between said first gate and said drain;

a second barrier is disposed between said first gate and said common output;

a third barrier is disposed between said source and said second gate; and a fourth barrier is disposed between said second gate and said common output.

3. The device of claim 2 wherein said first barrier, said second barrier, said third barrier, and said fourth barrier are formed of a third compound semiconductor type.

4. The device of claim 3 wherein said first compound semiconductor type, said second compound semiconductor type, and said third compound semiconductor type all have a substantially similar lattice constant.

5. The device of claim 4 wherein said first barrier, said second barrier, said third barrier, and said fourth barrier each has a thickness less than about 100 angstroms.

6. The device of claim 3 further comprising:

a fifth barrier of said third compound semiconductor type disposed on said common output; and a coupling layer of said first compound semiconductor type disposed between said fourth barrier and said fifth barrier.

7. The device of claim 1 wherein:

said drain is formed of said second compound semiconductor type;

said common output is formed of said second compound semiconductor type; and said source is formed of said first compound semiconductor type.

8. The device of claim 1 wherein:
said first compound semiconductor type is gallium antimonide; and
said second compound semiconductor type is indium arsenide.

9. The device of claim 3 wherein said third compound semiconductor type is aluminum antimonide.

10. The device of claim 1 wherein:
a first insulating layer is disposed on said first gate;
a first gate contact is disposed on said first insulating layer;
a second insulating layer is disposed on said second gate; and
a second gate contact is disposed on said second insulating layer.

11. The device of claim 10 further comprising:
a buffer layer underlying said common output; and
a semi-insulating gallium arsenide substrate underlying said buffer layer.

12. The device of claim 2 wherein:
said first barrier, said second barrier, and said first gate form a first quantum energy well; and
said third barrier, said fourth barrier, and said second gate form a second quantum energy well.

13. The device of claim 12 wherein said first quantum energy well provides a plurality of quantized energy levels for said first resonant interband tunneling transistor and said second quantum energy well provides a plurality of quantized energy levels for said second resonant interband tunneling transistor.

14. The device of claim 1 wherein said first resonant interband tunneling transistor is in a substantially conducting state when said second resonant interband tunneling transistor is in a substantially non-conducting state, and said first resonant interband tunneling transistor is in a substantially non-conducting state when said second resonant interband tunneling transistor is in a substantially conducting state.

15. The device of claim 14 wherein said complementary heterojunction semiconductor device forms an inverter.

16. A semiconductor device, comprising:
(a) a first heterojunction transistor comprising:
an InAs output layer;
a first AlSb layer on said InAs output layer;
a GaSb gate layer on said first AlSb layer;
a second AlSb layer on said GaSb gate layer; and
an InAs drain layer on said second AlSb layer; and
(b) a second heterojunction transistor coupled to said first heterojunction transistor, comprising:
a third AlSb layer on said InAs output layer;
a GaSb coupling layer on said third AlSb layer;
a fourth AlSb layer on said GaSb coupling layer;
an InAs gate layer on said fourth AlSb layer;
a fifth AlSb layer on said InAs gate layer; and
a GaSb source layer on said fifth AlSb layer.

17. The device of claim 16 further comprising:
a first insulating layer on said GaSb gate layer;
a first gate contact on said first insulating layer;
a second insulating layer on said InAs gate layer; and
a second gate contact on said second insulating layer.

18. The device of claim 17 further comprising:
an epitaxial buffer layer underneath said InAs output layer; and
a semi-insulating GaAs substrate underneath said epitaxial buffer layer.

19. The device of claim 18 wherein:
an ohmic output contact is on said InAs output layer;
an ohmic drain contact is on said InAs drain layer; and
an ohmic source contact is on said GaSb source layer.

20. The device of claim 16 wherein said first heterojunction transistor and said second heterojunction transistor are resonant interband tunneling transistors.

21. A complementary heterojunction semiconductor device, comprising:
a first resonant interband tunneling transistor having a first gate of a first semiconductor type, a drain coupled to said first gate, and a common output coupled to said first gate; and
a second resonant interband tunneling transistor having a second gate of a second semiconductor type, said second gate coupled to said common output, and a source coupled to said second gate, wherein said first semiconductor type has a valence band having an energy greater than a conduction band of said second semiconductor type when said complementary heterojunction semiconductor device is in an unbiased state.

22. The device of claim 21 wherein:
said first semiconductor type is silicon; and
said second semiconductor type is GaN.

* * * * *